United States Patent
Perzlmaier et al.

(10) Patent No.: US 11,855,245 B2
(45) Date of Patent: Dec. 26, 2023

(54) OPTOELECTRONIC SEMICONDUCTOR COMPONENT COMPRISING A FIRST AND SECOND CONTACT ELEMENT, AND METHOD FOR PRODUCING THE OPTOELECTRONIC SEMICONDUCTOR COMPONENT

(71) Applicant: Osram OLED GmbH, Regensburg (DE)

(72) Inventors: Korbinian Perzlmaier, Regensburg (DE); Alexander F. Pfeuffer, Regensburg (DE); Kerstin Neveling, Pentling (DE)

(73) Assignee: Osram OLED GmbH, Regensburg (DE)

( * ) Notice: Subject to any disclaimer, the term of this patent is extended or adjusted under 35 U.S.C. 154(b) by 495 days.

(21) Appl. No.: 17/275,675

(22) PCT Filed: Sep. 12, 2019

(86) PCT No.: PCT/EP2019/074383
§ 371 (c)(1),
(2) Date: Mar. 12, 2021

(87) PCT Pub. No.: WO2020/053344
PCT Pub. Date: Mar. 19, 2020

(65) Prior Publication Data
US 2022/0123189 A1    Apr. 21, 2022

(30) Foreign Application Priority Data
Sep. 14, 2018 (DE) .................. 10 2018 122 568.7

(51) Int. Cl.
*H01L 33/62* (2010.01)
*H01L 33/38* (2010.01)

(52) U.S. Cl.
CPC ............ *H01L 33/62* (2013.01); *H01L 33/382* (2013.01)

(58) Field of Classification Search
None
See application file for complete search history.

(56) References Cited

U.S. PATENT DOCUMENTS

| 9,425,359 B2 * | 8/2016 | Tsai ................... H01L 33/385 |
| 2013/0187192 A1 * | 7/2013 | Hoeppel ........... H01L 31/02005 |
| | | 438/26 |

(Continued)

FOREIGN PATENT DOCUMENTS

| DE | 102010025320 A1 | 12/2011 |
| DE | 102012217533 A1 | 3/2014 |

(Continued)

OTHER PUBLICATIONS

German Search Report issued for the DE Patent Application No. 10 2018 122 568.7 dated Oct. 22, 2018, 6 pages (for reference purposes only).

(Continued)

*Primary Examiner* — Nduka E Ojeh
(74) *Attorney, Agent, or Firm* — VIERING, JENTSCHURA & PARTNER MBB

(57) ABSTRACT

An optoelectronic semiconductor element may include an optoelectronic semiconductor chip. The optoelectronic semiconductor chip may include a first semiconductor layer of a first conductivity type, a second semiconductor layer of a second conductivity type, a first contact element connected to the first semiconductor layer in an electrically conductive manner, and a second contact element connected to the second semiconductor layer in an electrically conductive manner. The first semiconductor layer and the second semiconductor layer are arranged one above the other to form a layer stack. The first semiconductor layer to where the (Continued)

second semiconductor layer is exposed. The first contact element is arranged over the first semiconductor layer, and the second contact element is arranged over the first semiconductor layer.

16 Claims, 14 Drawing Sheets

(56) References Cited

U.S. PATENT DOCUMENTS

2015/0255685 A1* 9/2015 Herrmann ............. H01L 33/382
    438/27
2018/0358512 A1* 12/2018 Hoeppel ................. H01L 33/62

FOREIGN PATENT DOCUMENTS

| DE | 102015100578 A1 | 7/2016 |
|----|-----------------|--------|
| JP | 2016032009 A | 3/2016 |
| KR | 20180026966 A | 3/2018 |

OTHER PUBLICATIONS

International Search Report for the corresponding PCT Patent Application No. PCT/EP2019/074383, dated Dec. 5, 2019, 3 pages (for reference purposes only).

* cited by examiner

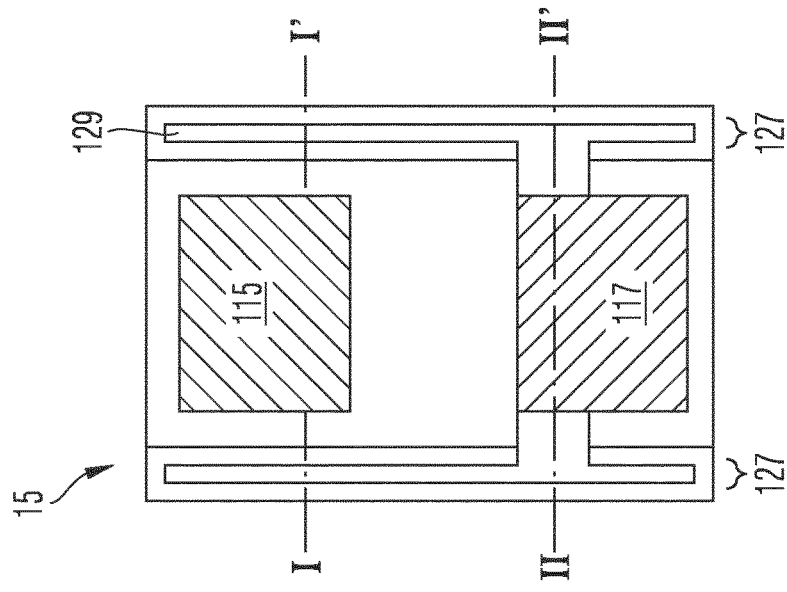
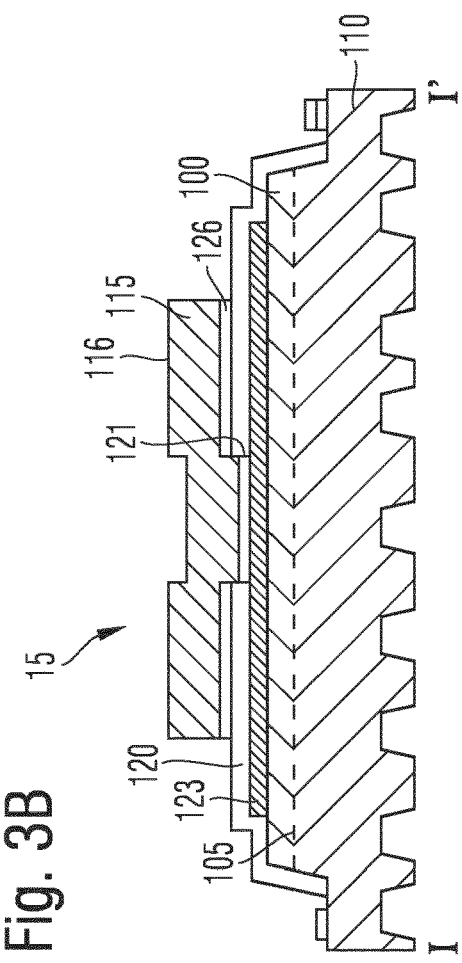
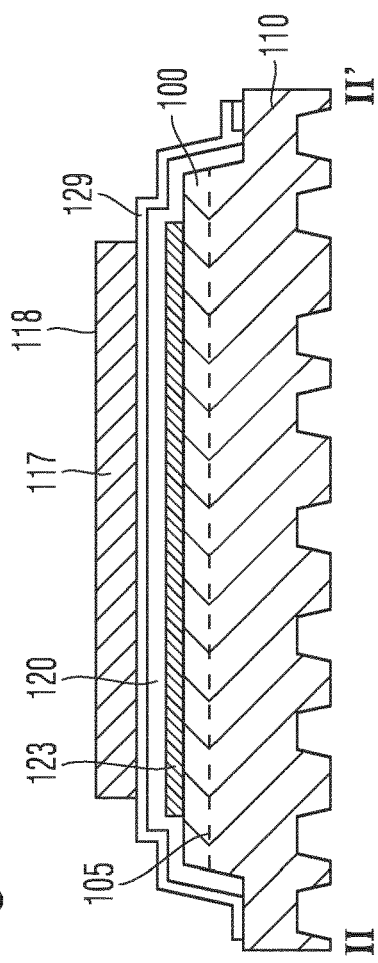

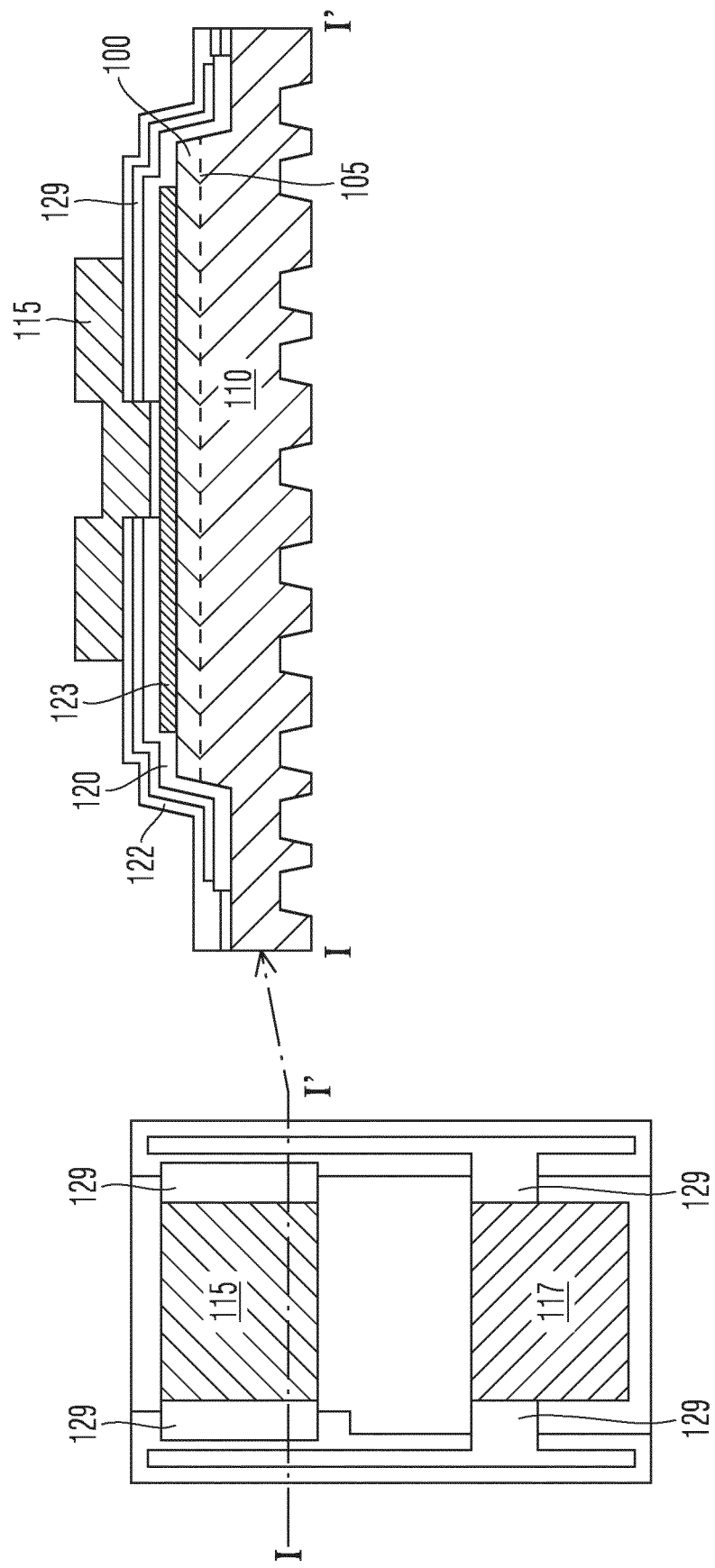

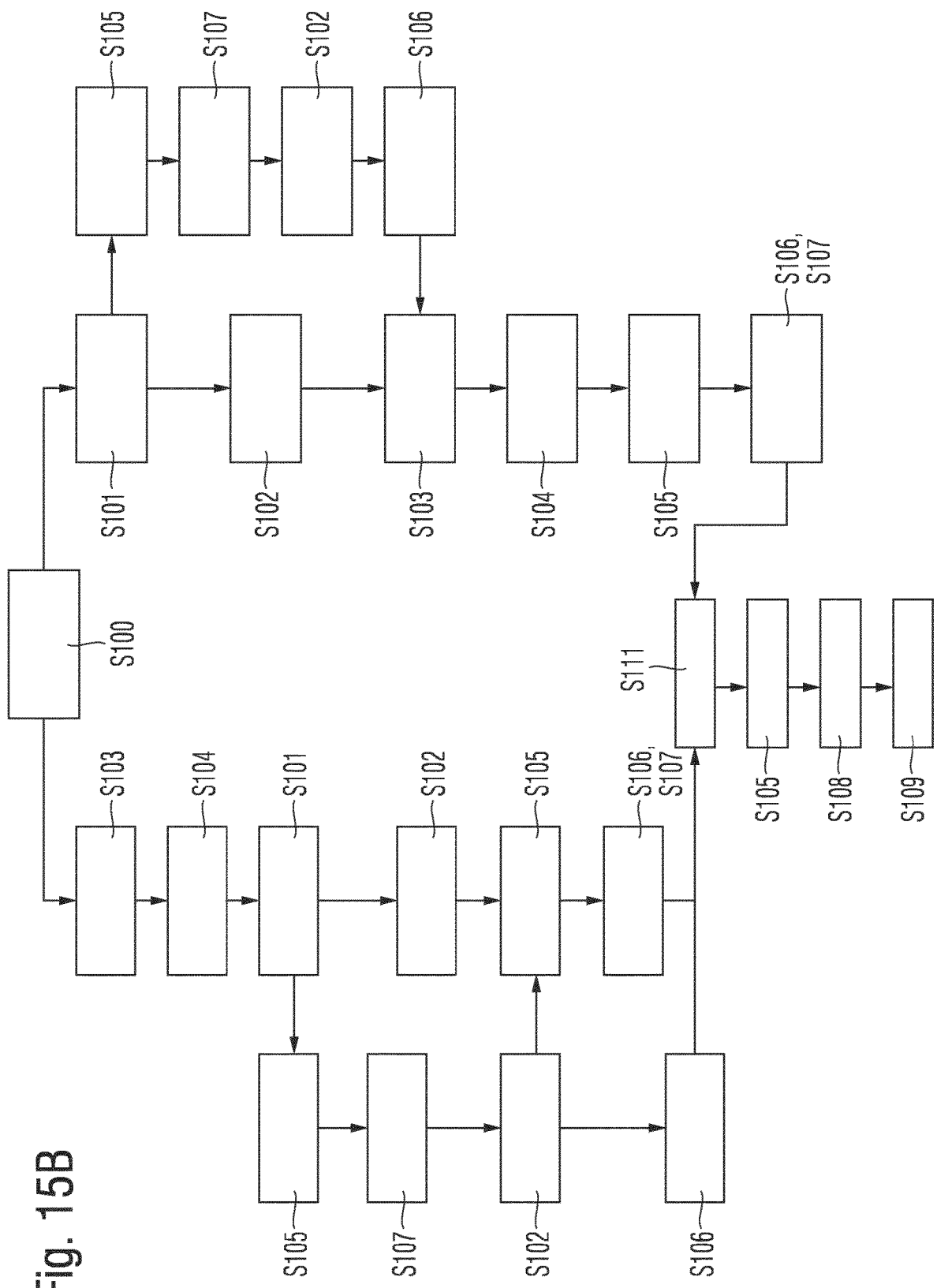

OPTOELECTRONIC SEMICONDUCTOR COMPONENT COMPRISING A FIRST AND SECOND CONTACT ELEMENT, AND METHOD FOR PRODUCING THE OPTOELECTRONIC SEMICONDUCTOR COMPONENT

CROSS-REFERENCE TO RELATED APPLICATIONS

The present application is a national stage entry according to 35 U.S.C. § 371 of PCT Application No. PCT/EP2019/074383 filed on Sep. 12, 2019; which claims priority to German Patent Application Serial Nos. 10 2018 122 568.7 filed on Sep. 14, 2018; all of which are incorporated herein by reference in their entirety and for all purposes.

TECHNICAL FIELD

The present disclosure relates to optoelectronic semiconductor elements having optoelectronic semiconductor chips where the chip has a layer stack having a first layer patterned to where a part of a second semiconductor layer is exposed.

BACKGROUND

A light-emitting diode (LED) is a light emitting device which is based on semiconductor materials. For example, an LED comprises a pn junction. If electrons and holes recombine with one another in the area of the pn junction, for example, because a corresponding voltage is applied, electromagnetic radiation is generated.

In so-called flip-chip components, contact elements for contacting the p- and the n-layers are arranged on a side facing away from the light-emitting surface.

In general, concepts are searched by which optoelectronic semiconductor elements may be improved.

The object of the present disclosure provides an improved optoelectronic semiconductor element and an improved method for producing an optoelectronic semiconductor element.

SUMMARY

An optoelectronic semiconductor element comprises an optoelectronic semiconductor chip. The optoelectronic semiconductor chip includes a first semiconductor layer of a first conductivity type, a second semiconductor layer of a second conductivity type, a first contact element which is connected to the first semiconductor layer in an electrically conductive manner, and a second contact element which is connected to the second semiconductor layer in an electrically conductive manner. The first semiconductor layer and the second semiconductor layer are arranged one above the other to form a layer stack. The first semiconductor layer is patterned so that part of the second semiconductor layer is exposed. The first contact element is arranged over the first semiconductor layer. The second contact element is arranged over the first semiconductor layer. Parts of the first contact element are arranged at the same vertical height as parts of the second contact element within an area in which the second contact element overlaps with the first semiconductor layer.

For example, a distance between a first main surface of the first contact element and a first main surface of the first semiconductor layer may be identical to the distance between a first main surface of the second contact element and the first main surface of the first semiconductor layer.

The first and the second contact elements may each have an identical composition. For example, the first and the second contact elements each form a topmost metalization level of the semiconductor chip.

For example, intermediate layers between the first contact element and the first semiconductor layer and between the second contact element and the first semiconductor layer are each identical. In this context, "identical" can mean that the intermediate layers each have the same or identical composition. Additionally or alternatively, "identical" can mean that the intermediate layers have the same or identical layer thickness. Furthermore, the respectively identical intermediate layers may be arranged continuously or in sections.

The optoelectronic semiconductor element may further include a first passivation layer which is arranged between the first semiconductor layer and, in each case, the first and second contact elements. The first passivation layer may be arranged continuously or in sections.

For example, at least 10% of a first main surface of the first contact element are arranged at the same vertical height as a first main surface of the second contact element. According to further embodiments, at least 20% or at least 30% of the first main surface of the first contact element may be arranged at the same vertical height as the first main surface of the second contact element.

The optoelectronic semiconductor element may further include a connecting element which is arranged between the second contact element and the second semiconductor layer.

The optoelectronic semiconductor element may further include a conductive layer which is connected to the second semiconductor layer and to the second contact element, with parts of the conductive layer being arranged between the first contact element and the first semiconductor layer.

According to further embodiments, an optoelectronic semiconductor element comprises an optoelectronic semiconductor chip. The optoelectronic semiconductor chip includes a first semiconductor layer of a first conductivity type, a second semiconductor layer of a second conductivity type, a first contact element which is connected to the first semiconductor layer in an electrically conductive manner, and a second contact element which is connected to the second semiconductor layer in an electrically conductive manner. The first semiconductor layer and the second semiconductor layer are arranged one above the other to form a layer stack. The first contact element and the second contact element are each arranged over the first semiconductor layer. Intermediate layers between the first contact element and the first semiconductor layer are each identical to intermediate layers between the second contact element and the first semiconductor layer. In this context, "identical" can mean that the intermediate layers each have the same or identical composition. Additionally or alternatively, "identical" can mean that the intermediate layers have the same or identical layer thickness.

For example, a first main surface of the first and the second contact elements each have the same distance from a first main surface of the first semiconductor layer. For example, the first and the second contact elements each have an identical composition.

According to embodiments, the second contact element is connected to the second semiconductor layer in an electrically conductive manner via openings in the first semiconductor layer.

According to embodiments, the optoelectronic semiconductor element comprises a carrier on which the optoelectronic semiconductor chip is applied. For example, a second main surface or an approximated second main surface of the second semiconductor layer is parallel to a first main surface of the carrier.

A method for producing an optoelectronic semiconductor element comprising an optoelectronic semiconductor chip includes forming a layer stack which includes a first semiconductor layer of a first conductivity type and a second semiconductor layer of a second conductivity type, and forming an electrically conductive layer. As a result, a first contact element and a second contact element are formed over the first semiconductor layer, the first contact element being connected to the first semiconductor layer in an electrically conductive manner, and the second contact element being connected to the second semiconductor layer in an electrically conductive manner.

An optoelectronic device comprises the aforedescribed optoelectronic semiconductor element. The optoelectronic device may, for example, be selected from a display device and a video wall.

BRIEF DESCRIPTION OF THE DRAWINGS

The accompanying drawings serve to provide an understanding of non-limiting embodiments. The drawings illustrate non-limiting embodiments and, together with the description, serve to explain them. Further non-limiting embodiments and numerous of the intended advantages emerge directly from the following detailed description. The elements and structures shown in the drawings are not necessarily shown true to scale. Identical reference numerals refer to identical or corresponding elements and structures.

FIG. 3A shows a schematic plan view of parts of an optoelectronic semiconductor chip according to further embodiments.

FIGS. 3B and 3C show vertical cross-sectional views through the optoelectronic semiconductor chip.

FIG. 4C shows a schematic plan view of parts of an optoelectronic semiconductor chip according to further embodiments.

FIG. 4D shows a vertical cross-sectional view through the optoelectronic semiconductor chip.

FIGS. 15A and 15B each illustrate parts of methods for producing an optoelectronic semiconductor element.

DETAILED DESCRIPTION

Figure 1A:
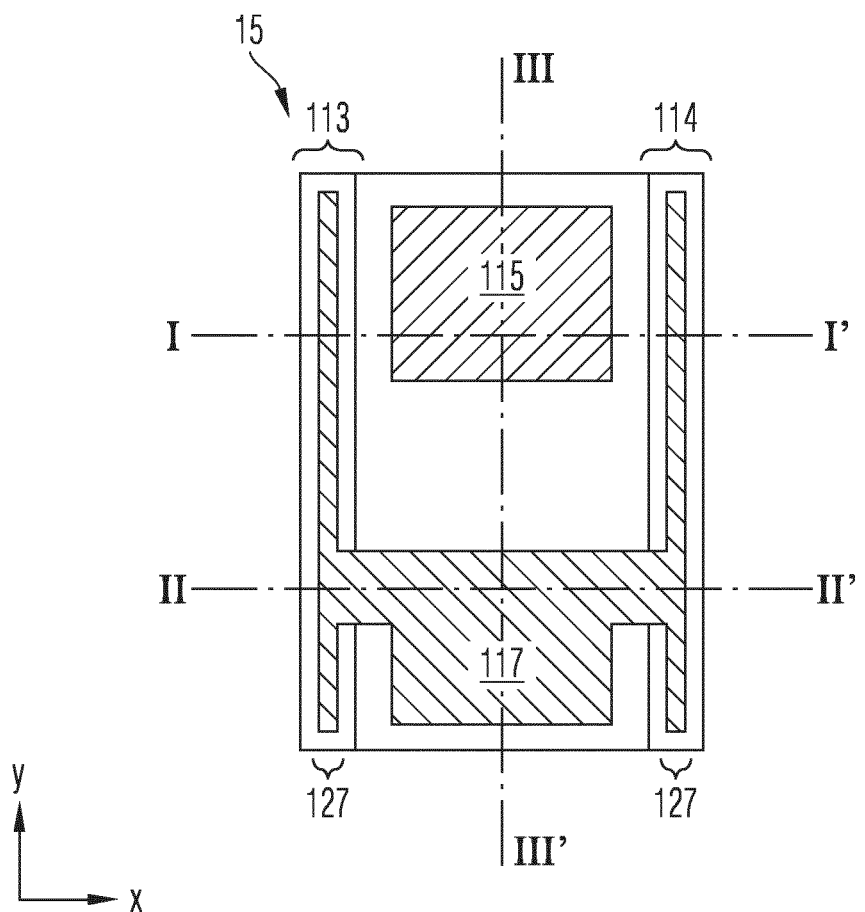
FIG. 1A shows a schematic plan view of parts of an optoelectronic semiconductor chip.

In the following detailed description, reference is made to the accompanying drawings, which form part of the disclosure, and in which specific exemplary embodiments are shown for purposes of illustration. In this context, directional terminology such as "top", "bottom", "front", "back", "over", "on", "in front of", "behind", "leading", "trailing", etc. refers to the orientation of the figures just described. Since the components of the exemplary embodiments may be positioned in different orientations, the directional terminology is only used for explanation and is not restrictive in any way.

The description of the exemplary embodiments is not restrictive, since also other exemplary embodiments exist and structural or logical changes may be made without deviating from the scope defined by the claims. In particular, elements of exemplary embodiments described in the following text may be combined with elements of other exemplary embodiments described, unless the context indicates otherwise.

The terms "wafer" and "semiconductor substrate" used in the following description may include any semiconductor-based structure that has a semiconductor surface. The wafer and structure are to be understood to include doped and undoped semiconductors, epitaxial semiconductor layers, possibly supported by a base, and further semiconductor structures. For example, a layer made of a first semiconductor material may be grown on a growth substrate made of a second semiconductor material or of an insulating material, for example, on a sapphire substrate. Depending on the intended use, the semiconductor may be based on a direct or an indirect semiconductor material. Examples of semiconductor materials particularly suited for generating electromagnetic radiation include, in particular, nitride semiconductor compounds which may, for example, generate ultraviolet, blue or longer-wave light such as GaN, InGaN, AlN, AlGaN, AlGaInN, phosphide semiconductor compounds, which may, for example, generate green or longer-wave light such as GaAsP, AlGaInP, GaP, AlGaP, as well as other semiconductor materials such as AlGaAs, SiC, ZnSe, GaAs, ZnO, $Ga_2O_3$, diamond, hexagonal BN, and combinations of the materials mentioned. The stoichiometric ratio of the compound semiconductor materials may vary. Further examples of semiconductor materials may include silicon, silicon germanium, and germanium. In the context of the present description, the term "semiconductor" also includes organic semiconductor materials.

The term "substrate" generally includes insulating, conductive or semiconductor substrates.

The terms "lateral" and "horizontal", as used in this description, are intended to describe an orientation or alignment which runs essentially parallel to a first surface of a substrate or semiconductor body. This may, for example, be the surface of a wafer or a chip (die).

The horizontal direction may, for example, lie in a plane perpendicular to a direction of growth when layers are grown on.

The term "vertical", as used in this description, is intended to describe an orientation which is essentially perpendicular to the first surface of a substrate or semiconductor body. The vertical direction may, for example, correspond to a direction of growth when layers are grown on.

To the extent that the terms "have", "contain", "comprise", "include" and the like are used herein, they are open-ended terms that indicate the presence of said elements or features, but do not rule out the presence of other elements or features. The indefinite articles and the definite articles include both the plural and the singular, unless the context clearly indicates otherwise.

In the context of this description, the term "electrically connected" means a low-ohmic electrical connection between the connected elements. The electrically connected elements need not necessarily be directly connected to one another. Additional elements may be arranged between electrically connected elements.

The term "electrically connected" also includes tunnel contacts between the connected elements.

The optoelectronic semiconductor elements described within the scope of the present description may both emit electromagnetic radiation and absorb or detect electromagnetic radiation. Although the emission of electromagnetic radiation is particularly described at some locations, it goes without saying that the elements described may be applied in an analog manner to light-absorbing or light-detecting components.

Figure 1B:
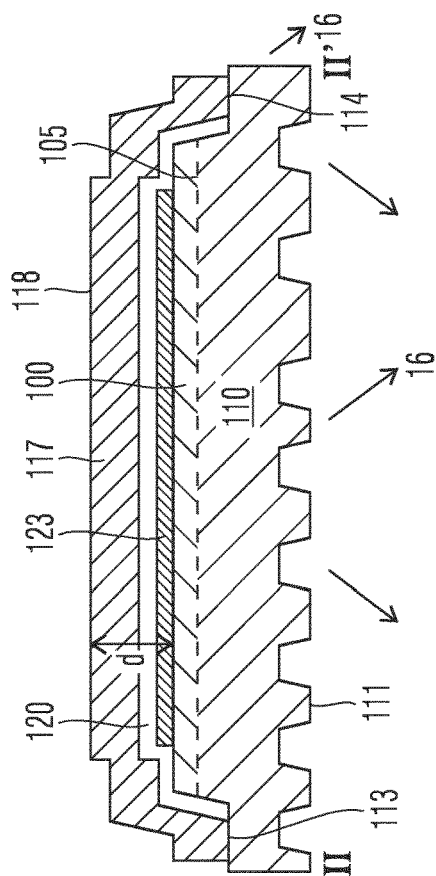
FIGS. 1B and 1C show vertical cross-sectional views through the optoelectronic semiconductor chip.
Figure 1C:
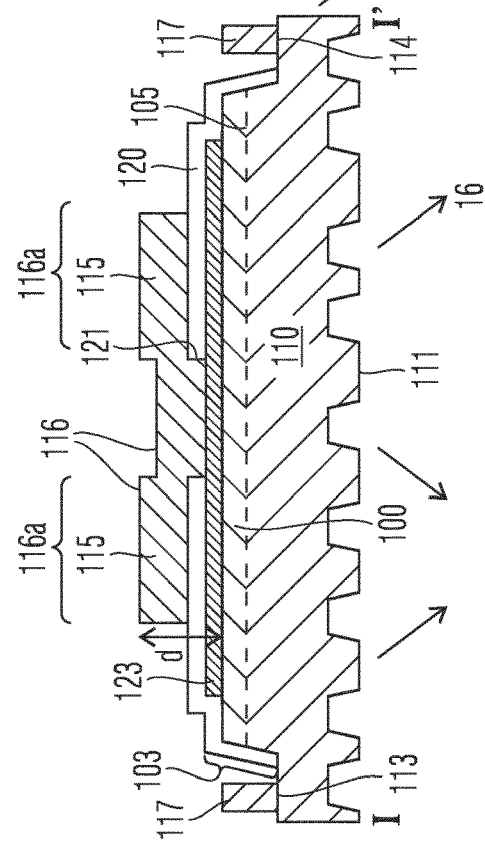

FIG. 1A shows a plan view of an optoelectronic semiconductor chip 15 which forms part of an optoelectronic semiconductor element according to embodiments. FIGS. 1B and 1C each show vertical cross-sectional views through the optoelectronic semiconductor chip 15 at the locations designated in FIG. 1A. In particular, the cross-sectional view of FIG. 1B is taken between I and I'. The cross-sectional view of FIG. 1B thus intersects a first contact element 115 of the optoelectronic semiconductor chip 15. The cross-sectional view of FIG. 1C is taken between II and II' and intersects a second contact element 117 of the optoelectronic semiconductor chip 15.

As illustrated in FIGS. 1A to 1C, an optoelectronic semiconductor chip 15 includes, as part of an optoelectronic semiconductor element, a first semiconductor layer 100 of a first conductivity type, for example, p-type, and a second semiconductor layer 110 of a second conductivity type, for example, n-type. The first semiconductor layer 100 and the second semiconductor layer 110 are arranged one above the other to form a layer stack. For example, as illustrated in FIGS. 1B and 1C, the first semiconductor layer 100 is arranged over the second semiconductor layer 110. The first semiconductor layer 100 may, for example, be patterned so that part of the second semiconductor layer 110 is exposed. In other words, a first main surface of the second semiconductor layer 110 is uncovered in places. The optoelectronic semiconductor chip 15 further includes a first contact element 115, which is connected to the first semiconductor layer 100 in an electrically conductive manner, and a second contact element 117, which is connected to the second semiconductor layer 110 in an electrically conductive manner. As illustrated in FIGS. 1A to 1C, the first contact element 115 is arranged over the first semiconductor layer 100. Furthermore, the second contact element 117 is arranged over the first semiconductor layer 100.

Parts of the first contact element 115 and of the second contact element 117 each overlap with the first semiconductor layer 100. Within this overlapping area, parts of the first and second contact elements are arranged at the same vertical height. For example, as illustrated in FIGS. 1A and 1B, the first contact element 115 may completely overlap with the first semiconductor layer 100. More specifically, part of the first semiconductor layer 100 is formed adjacent to each part of the first contact element 115. Furthermore, parts of the first semiconductor layer 100 are formed adjacent to the second contact element 117. The second contact element 117 may, however, have a greater horizontal expansion than the patterned first semiconductor layer 100. For example, part of the second contact element 117 may extend as far as the second semiconductor layer 110. In the area in which the first semiconductor layer 100 is formed adjacent to the second contact element 117, parts of the second contact element 117 are arranged at the same vertical height as the first contact element 115.

For example, parts of the first and the second contact elements overlap in the vertical direction in areas in which both the first contact element overlaps with the first semiconductor layer and parts of the second contact element overlap horizontally with the first semiconductor layer. For example, a first main surface 116 of the first contact element 115 may have the same distance d from a first main surface 101 of the first semiconductor layer 100 as a first main surface 118 of the second contact element 117. According to embodiments, the first and the second contact elements 115, 117 may each have an identical composition. For example, they may have identical materials. Furthermore, a composition ratio of the materials may be the same in each case.

For example, the first and the second contact elements 115, 117 may form a topmost metalization level of the semiconductor chip 15. In order to connect the semiconductor chip to a suitable carrier, a further layer is not applied over the first contact element or the second contact element 115, 117. According to embodiments, a solder material for the electrical connection of the first and second contact elements 115, 117 may also be applied by a soldering process.

As illustrated in FIGS. 1B and 1C, intermediate layers may be provided between the first semiconductor layer 100 and the first or the second contact element 115, 117. For example, these intermediate layers may include a first current spreading layer 123 and a first passivation layer 120. The first passivation layer 120 may, for example, contain silicon oxide, silicon nitride, aluminum oxide, titanium oxide, niobium oxide, tantalum nitride, tantalum oxide or combinations of these oxides or nitrides. According to embodiments, intermediate layers between the first contact element 115 and the first semiconductor layer 100 and between the second contact element 117 and the first semiconductor layer 100 are each identical. In this process, an opening may, for example, be provided in the insulating intermediate layers in order to connect the first contact element 115 to the electrically conductive layers underneath. FIG. 1B shows a first opening 121 formed in the passivation layer 120. Through this, the first contact element 115 is connected to the conductive layer 123 underneath in an electrically conductive manner. The conductive layer 123 may, for example, be a first current spreading layer or a contact layer. For example, the first passivation layer 120 may be provided in order to electrically isolate the first semiconductor layer 100 from the second contact element 117. Furthermore, the first current spreading layer or contact layer 123 may be provided in order to bring about a uniform current injection into the first semiconductor layer by the first contact element 115. Moreover, the first passivation layer is provided between the first semiconductor layer and the first contact element 115, without it being necessary for the electrical functionality of the optoelectronic semiconductor chip 15. The first current spreading layer 123 is further arranged between the first semiconductor layer and the second contact element 117.

As illustrated in FIG. 1B, the first contact element 115 may be arranged in an area in which the first contact element 115 is formed in the opening 121 in order to contact the conductive layers underneath, at a lower height than the remaining part of the first contact element 115 and the second contact element 117. For example, a ratio of surface portions 116a of the first contact element that have the same height as the second contact element 117 may be at least 10%, for example, at least 20% or at least 30%, of the total area of the surface 116 of the first contact element 115. According to further embodiments, the ratio may be at least 50% of the total area of the surface 116 of the first contact element 115.

According to embodiments, an active zone 105 may be arranged between the first semiconductor layer 100 and the second semiconductor layer 110.

For example, an active zone may be arranged between the first and the second semiconductor layers. The active zone may, for example, have a pn junction, a double heterostructure, a single quantum well structure (SQW, single quantum well) or a multi quantum well structure (MQW, multi quantum well) for the generation of radiation. In this process, the term "quantum well structure" has no meaning with regard to the dimensionality of the quantization. Thus, it includes, among other things, quantum wells, quantum wires and quantum dots, as well as any combination of these layers.

According to embodiments, a second main surface 111 of the second semiconductor layer 110 may be a light-emitting surface, i.e. electromagnetic radiation 16 emitted by the optoelectronic semiconductor element may be output via the second main surface 111 of the second semiconductor layer 110. For example, a further substrate may not be provided adjacent to the second semiconductor layer 110. The second main surface 111 of the second semiconductor layer 110 may be patterned in order to increase the outcoupling efficiency. Electromagnetic radiation 16 may also be emitted via side surfaces of the semiconductor chip 15.

The first semiconductor layer 100 is patterned to form a mesa 103. Part of the active zone 105 is exposed in the area of the mesa flank. The first passivation layer 120 may extend along the mesa edge and be arranged over the exposed area of the active zone 105. As illustrated in FIGS. 1A to 1C, part of the second contact element 117 may, for example, be arranged in contact with the second semiconductor layer 110. For example, part of the second contact element 117 may extend along a y-direction of the optoelectronic semiconductor chip 15. Furthermore, as illustrated in FIG. 1C, a further part of the second contact element 117 may, in the x-direction, extend from a first exposed part 113 of the second semiconductor layer 110 to a second exposed part 114 of the second semiconductor layer 110. In particular, the second contact element 117 may, along the mesa flank, extend from the first main surface 101 of the first semiconductor layer 100 to the first main surface of the second semiconductor layer 110 in each case. The second contact element forms a contact portion 127 at points where it is connected to the second semiconductor layer 110 in an electrically conductive manner.

Figure 1E:
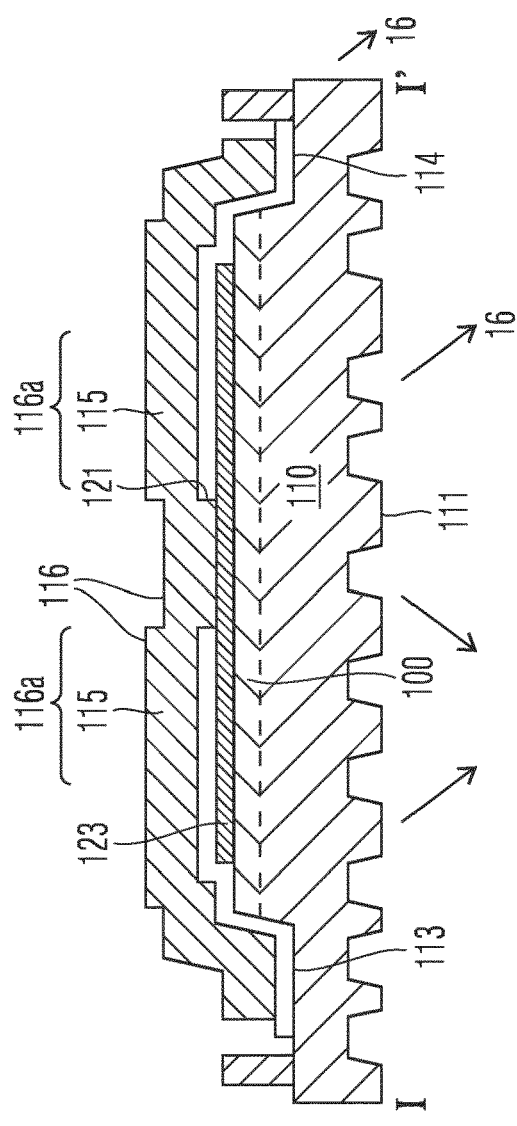
FIG. 1E shows a vertical cross-sectional view through the optoelectronic semiconductor chip according to the further modification.
Figure 1D:
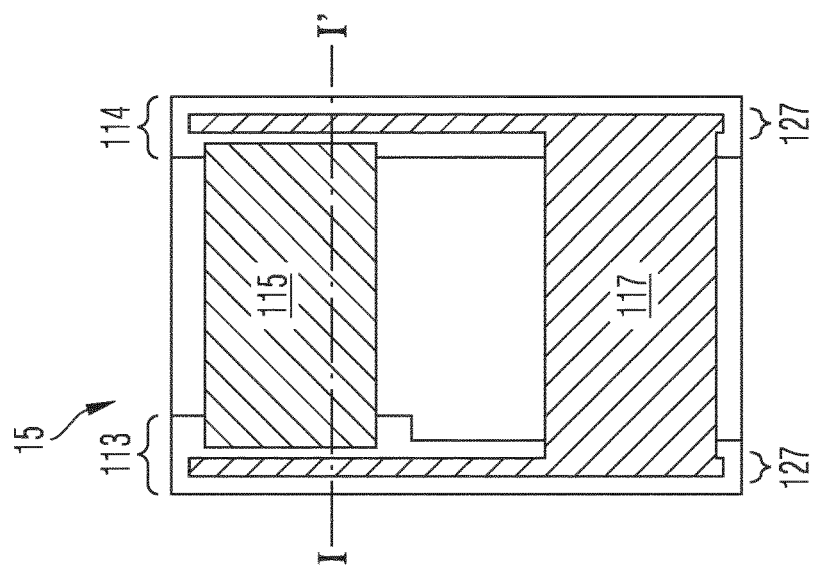
FIG. 1D shows a plan view through the optoelectronic semiconductor chip according to a further modification.

FIG. 1D shows a plan view of the optoelectronic semiconductor chip according to a modification. FIG. 1E shows a cross-sectional view between I and I', so that the first contact element 115 is intersected. The semiconductor chip 15 has similar elements as the semiconductor chip 15 illustrated in FIGS. 1A to 1C. Deviating from this semiconductor chip, the conductive layer that forms the first contact element 115 is arranged over side flanks of the mesa 103.

The first contact element is isolated from the semiconductor material in the area of the side flanks of the mesa 103, for example, by the first passivation layer 120. In addition, part of the first contact element 115 may also overlap with the first and/or second exposed parts 113, 114 of the second semiconductor layer 110. Here too, the overlapping part of the first contact element 115 is isolated from the second semiconductor layer 110, for example, by the first passivation layer 120. With this configuration of the first contact element 115, the mesa flank may, for example, be mirrored, whereby the outcoupling efficiency may be increased. Furthermore, the mechanical stability of the semiconductor chip may be increased.

According to a further approach, the optoelectronic semiconductor element, as illustrated in FIGS. 1A to 1E, includes an optoelectronic semiconductor chip 15 which has a first semiconductor layer 100 of a first conductivity type and a second semiconductor layer 110 of a second conductivity type. The first semiconductor layer 100 and the second semiconductor layer 110 are arranged one above the other to form a layer stack. The optoelectronic semiconductor chip 15 further includes a first contact element 115, which is connected to the first semiconductor layer 100 in an electrically conductive manner, and a second contact element 117, which is connected to the second semiconductor layer 110 in an electrically conductive manner. The first contact element 115 is arranged over the first semiconductor layer 100, the second contact element 117 is arranged over the first semiconductor layer 100. Layers arranged between the first contact element 115 and the first semiconductor layer 100 are identical to intermediate layers between the second contact element 117 and the first semiconductor layer 100. For example, a first main surface 116 of the first contact element 115 may have the same distance from a first main surface 101 of the first semiconductor layer 100 as a first main surface 118 of the second contact element 117. According to embodiments, the first and the second contact elements 115, 117 may each have an identical composition. According to embodiments, the second contact element 117 may be connected to the second semiconductor layer 110 in an electrically conductive manner via openings in the first semiconductor layer 100.

Figures 2A, 2B, 2C:
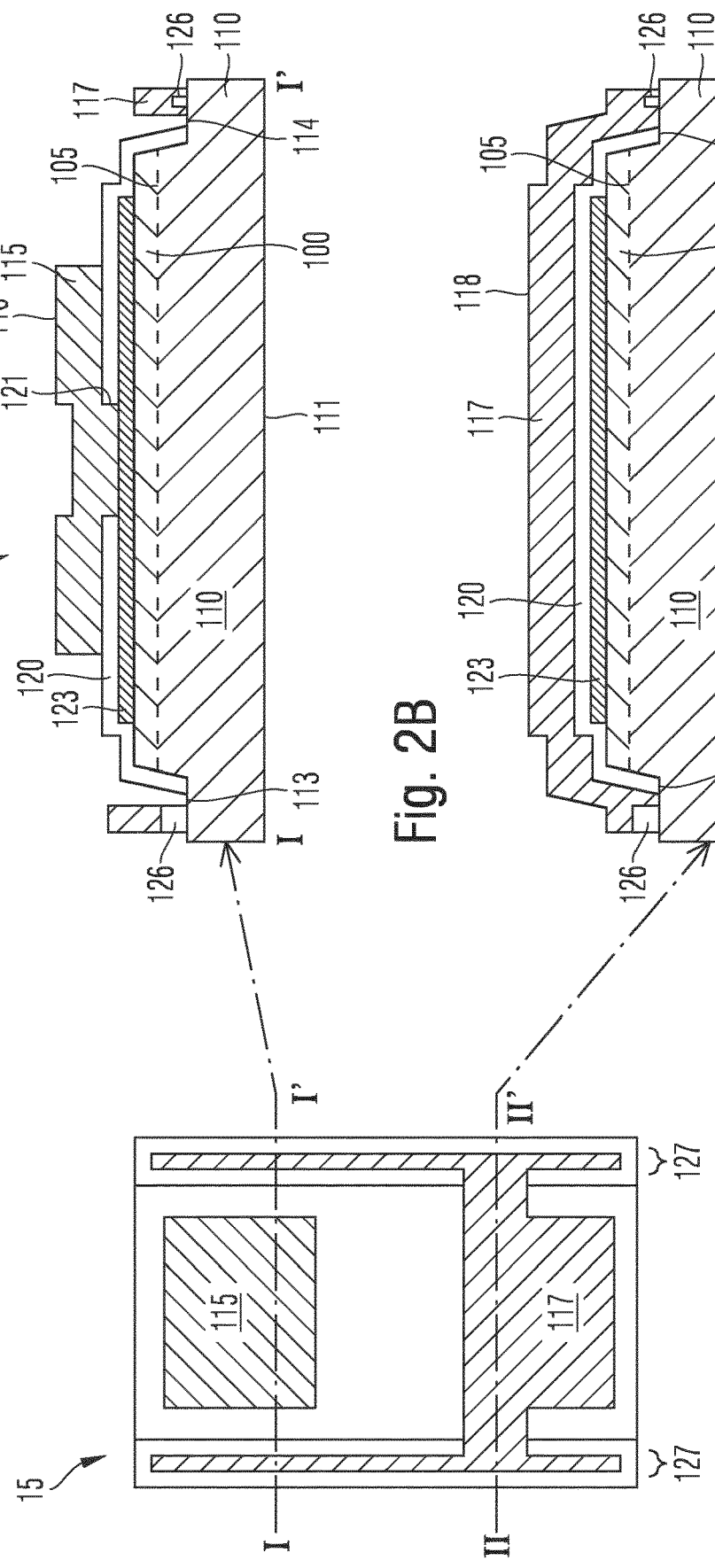
FIGS. 2A and 2B show vertical cross-sectional views through an optoelectronic semiconductor chip according to further embodiments.
FIG. 2C shows a schematic plan view of parts of the optoelectronic semiconductor chip.

According to embodiments, which are illustrated in FIGS. 2A and 2B, an additional connecting element 126 may be arranged between the second contact element 117 and the second semiconductor layer 110. For example, the connecting element 126, as illustrated in the left-hand part of FIGS. 2A and 2B, may be arranged between the second contact element and the second semiconductor layer 110 as an intermediate layer. According to further embodiments, however, the connecting element 126 may also be completely encapsulated by the second contact element 117, as illustrated in the right-hand part of FIGS. 2A and 2B.

The connecting element 126 may be constructed from ITO (indium tin oxide). For example, the contact resistance to the second contact element 117 may be improved by using the ITO layer. According to further embodiments, however, the connecting element 126 may also be constructed from other materials. For example, it may contain a material such as Al or Ag and be completely encapsulated by the second contact element 117. The connecting element 126 is only arranged between the second contact element 117 and the second semiconductor layer 110, but not over the first semiconductor layer 100, for example, between the first semiconductor layer 100 and the first or second contact element 115, 117.

As illustrated in FIGS. 2A and 2B, the second main surface 111 of the second semiconductor layer 110 may also not be patterned, but rather configured as a planar surface.

FIG. 2C shows a plan view of the optoelectronic semiconductor chip 15 to illustrate the position of the cross sections.

As illustrated in FIGS. 3A to 3C, a further conductive layer 129 may be provided according to further embodiments. For example, the further conductive layer 129 may be provided as a separate current expansion or current spreading layer and contain gold, for example. For example, processing properties of the conductive layer 129 may be different from the material of the first and second contact elements 115 and 117. FIG. 3A shows a plan view of the optoelectronic semiconductor element. FIGS. 3B and 3C show cross-sectional views analog to those shown in FIGS. 1B and 1C. As can be seen, the conductive layer 129 is arranged in the first and second exposed parts 113, 114 of the first main surface of the second semiconductor layer 110. Furthermore, the conductive layer 129 extends, along the flank of the mesa 103, from the first exposed part 113 over the first main surface 101 of the first semiconductor layer 100 to the second exposed part 114 of the second semiconductor layer 110. The conductive layer 129 may be interrupted in pieces or formed continuously. The conductive layer 129 may form contact pads. The second contact element 117 is arranged over the conductive layer 129. According to embodiments, which are illustrated in FIG. 3B, the conductive layer 129 is arranged between the first contact element 115 and the first semiconductor layer 100 and is separated from other parts of the conductive layer 129. In this way, it is ensured that intermediate layers between the first contact element 115 and the first semiconductor layer 100 are each identical to intermediate layers between the second contact element 117 and the first semiconductor layer 100. According to further embodiments, as illustrated in the right-hand part of FIGS. 3B and 3C, an additional connecting element 126 may be arranged between the conductive layer 129 and the second semiconductor layer 110.

Figure 4A:
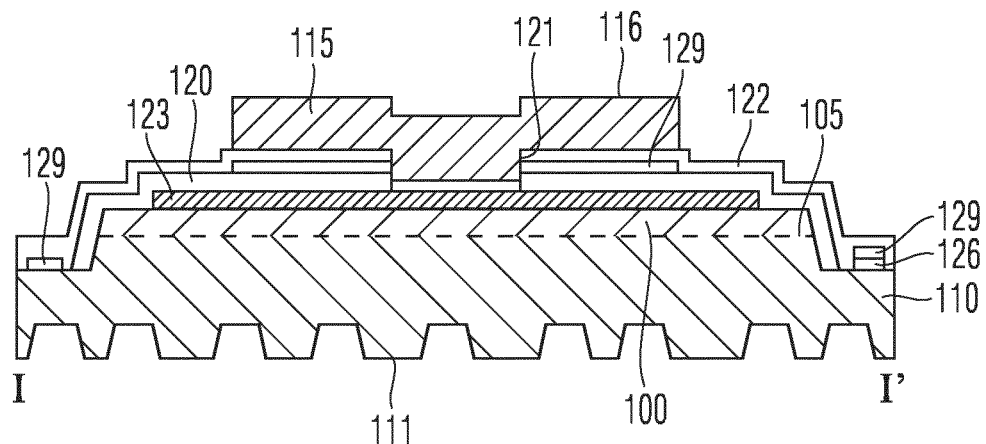
FIGS. 4A and 4B show vertical cross-sectional views through an optoelectronic semiconductor chip according to further embodiments.
Figure 4B:
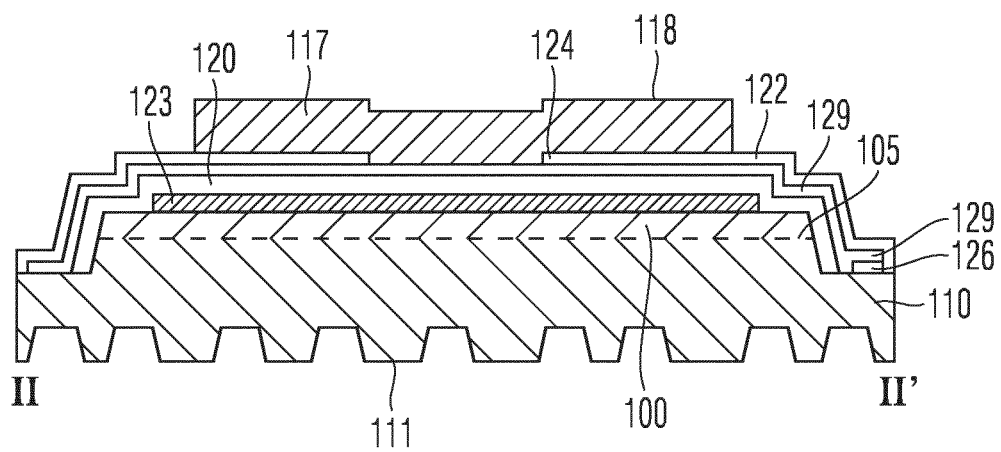

According to further embodiments, which are illustrated in FIGS. 4A and 4B, a second passivation layer 122 may further be provided over the conductive layer 129. For example, the second passivation layer 122 may have the same composition as the first passivation layer or a composition differing therefrom. The second passivation layer is arranged over the conductive layer 129 and encapsulates it. For example, a second opening 124 may be arranged in the second passivation layer 122, so that the second contact element 117 is connected to the conductive layer 129 in an electrically conductive manner. Furthermore, the second passivation layer 122 may also be arranged between the first contact element 115 and the first semiconductor layer 100. For example, the second passivation layer may be formed over the entire area of the semiconductor chip and thus cover the entire area of the side flanks of the mesa.

FIG. 4C shows a plan view of a semiconductor chip 15 according to further embodiments. FIG. 4D shows a vertical cross-sectional view through the semiconductor chip 15 between I and I'. The semiconductor chip is constructed similarly to that illustrated in FIGS. 4A and 4B. Deviating therefrom, the conductive layer 129 is routed over the side flanks of the mesa 103. The conductive layer 129 is isolated from the first and second semiconductor layers, for example, by the first passivation layer 120. In this way, an improved mirroring of the side flanks of the mesa 103 may be achieved.

As has been described, the first contact element and the second contact element may, according to embodiments, each be formed up to the same height. They may each have an identical material. For example, they may be deposited at the same time. Furthermore, intermediate layers between the first contact element and the first semiconductor layer may, for example, be identical to intermediate layers between the second contact element and the first semiconductor layer. As a result, a first main surface 116 of the first contact element and a first main surface 118 of the second contact element each lie at the same vertical height along the z-direction, as is also illustrated in FIGS. 1B and 1C.

Figure 5A:
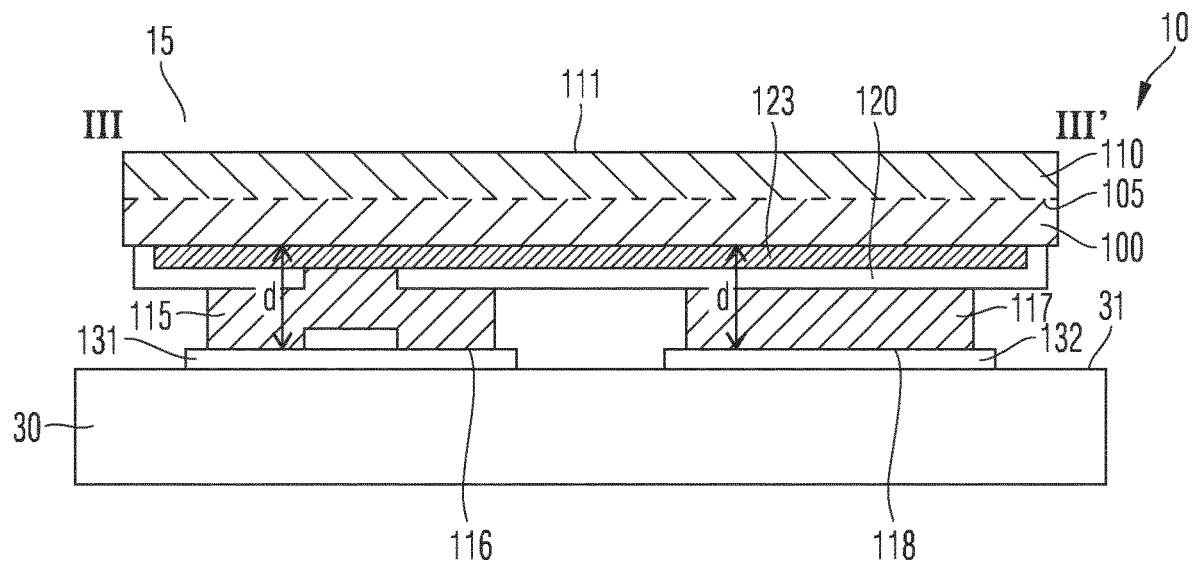
FIGS. 5A and 5B show vertical cross-sectional views through an optoelectronic semiconductor element according to embodiments.

FIG. 5A shows a vertical cross-sectional view of an optoelectronic semiconductor element 10, which includes the aforedescribed optoelectronic semiconductor chip 16 and a carrier 30. The cross-sectional view intersects the optoelectronic semiconductor chip between III and III', as illustrated in FIG. 1A. The carrier may, for example, be constructed from an insulating or semiconductor material and have a first and a second landing surface 131, 132. For example, electrical lines may each be connected to the first and second landing surfaces 131, 132. When mounting the semiconductor chip 15 on the carrier 30, the first contact element 115 is brought into contact with the first landing surface 131, for example. The second contact element 117 is brought into contact with the second landing surface 132.

As a result of the fact that the first main surface of the first contact element 115 and the first main surface of the second contact element 117 each lie at the same vertical height along the z-direction, it is possible to prevent the semiconductor chip from tilting whilst being mounted on the carrier 30. Due to the fact that the first and second contact elements are at the same height, the optoelectronic semiconductor chip 15 may be aligned flat in a simple manner when mounted on the carrier 30. As illustrated in FIG. 5A, the second main surface 111 of the second semiconductor layer 110 may be parallel to a first main surface 31 of the carrier 30 as a result. Furthermore, the distance d between the first main surface 116 of the first contact element and the first main surface 101 of the first semiconductor layer may be equal to the distance d between the first main surface 118 of the second contact element 117 and the first main surface 101 of the first semiconductor layer 100.

Figure 5B:
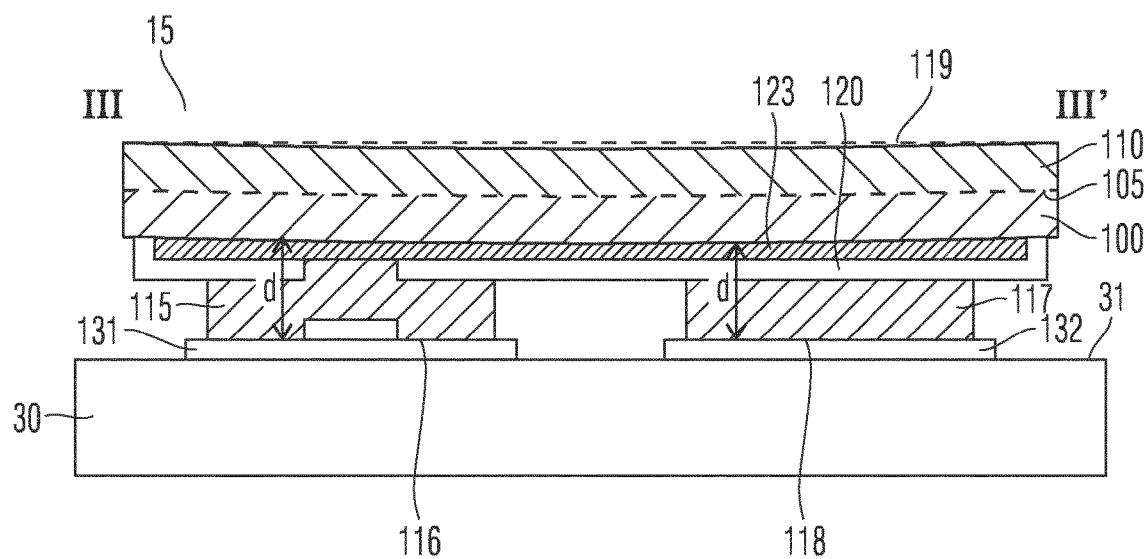

As illustrated in FIG. 5B, an approximated second main surface 119 of the second semiconductor layer 110 may, when the optoelectronic semiconductor chip 15 is bent or when the second main surface 111 of the second semiconductor layer 110 is patterned, be parallel to a first main surface 31 of the carrier 30. For example, if the optoelectronic semiconductor chip is bent, the approximated second main surface 119 of the second semiconductor layer 110 may contact the second semiconductor layer 110 in the edge areas of the second semiconductor layer 110.

As a result, a change in the radiation pattern which could be caused by a tilted semiconductor chip, may be prevented. For example, when using the optoelectronic semiconductor element in a display device, for example, a video wall, it is important that the far-field emission profile for the individual LEDs is well-defined and is not changed by tilting effects. Such tilting effects may be suppressed by the described special arrangement of the first and second contact elements. Furthermore, according to embodiments, the structure of the LED may be greatly simplified.

For example, the contact elements may have a height of 50 nm or more, for example, up to 100 nm or more. The height may also be more than 200 nm, for example, 300 nm. This may be the case, for example, when the contact elements do not contain any solder material. If the contact elements contain a solder material, or if a solder material is used for the electrical connection, then the thickness of the contact elements may be in the µm range. For example, the thickness may be less than 5 µm, for example, approximately 1 µm to 2 µm, for example, approximately 1.5 µm. A layer thickness of the semiconductor layer stack may, for example, be less than 10 µm. For example, the semiconductor layer stack may have a layer thickness of more than 2 µm and less than 10 µm.

Examples of a chip size are 8×15 µm$^2$, for example, 1 mm$^2$ or 1×2 mm$^2$. Of course, sizes in between are also possible, for example, 40×50 µm$^2$, 100×100 µm$^2$ or 100×150 µm$^2$.

The following FIGS. 6 to 14 show different layouts of the optoelectronic semiconductor chip 15 according to embodiments.

Figure 6:
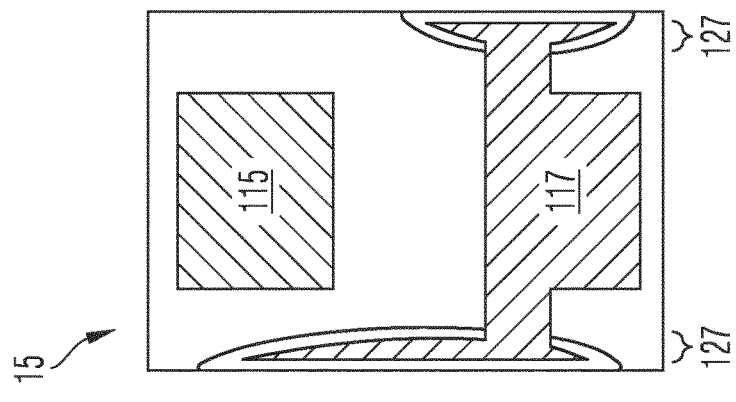

As illustrated in FIG. 6, the contact portions 127 for connecting the second contact element 117 may each be rounded. This means, unlike in FIG. 1A, for example, the exposed parts 113, 114 of the second semiconductor layer are not arranged in strips, but rather somewhat rounded. This special shape of the exposed parts 113, 114 of the second semiconductor layer 110 may be achieved by a corresponding layout during etching. This special shape of the exposed parts 113, 114 of the second semiconductor layer 110 may, for example, increase the mechanical stability.

Figure 8:
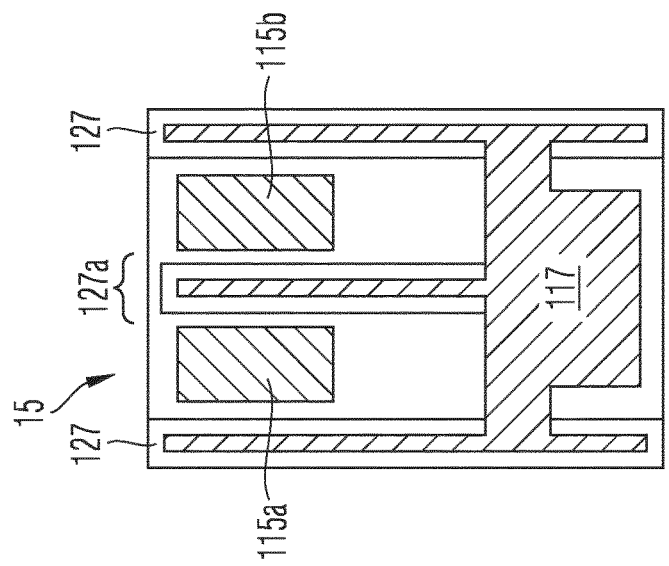
FIGS. 6 to 14 show schematic plan views of optoelectronic semiconductor chips according to further embodiments.
Figure 7:
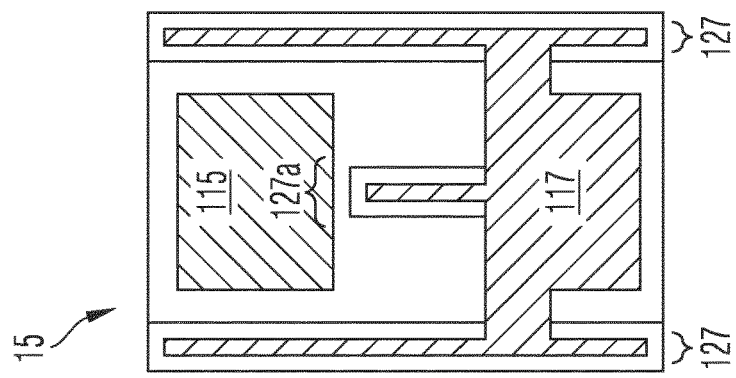

According to further embodiments, as illustrated in FIG. 7, the contact portion 127 for connecting the second contact element 117 to the second semiconductor layer 110 may be enlarged. This may, for example, happen if the first semiconductor layer 100 is patterned in such a manner that parts of the first semiconductor layer are also removed in its central area and an additional contact portion 127a is formed at this location. As illustrated in FIG. 8, the first contact element 115 may additionally be split into two first contact elements 115a, 115b.

Figure 9:
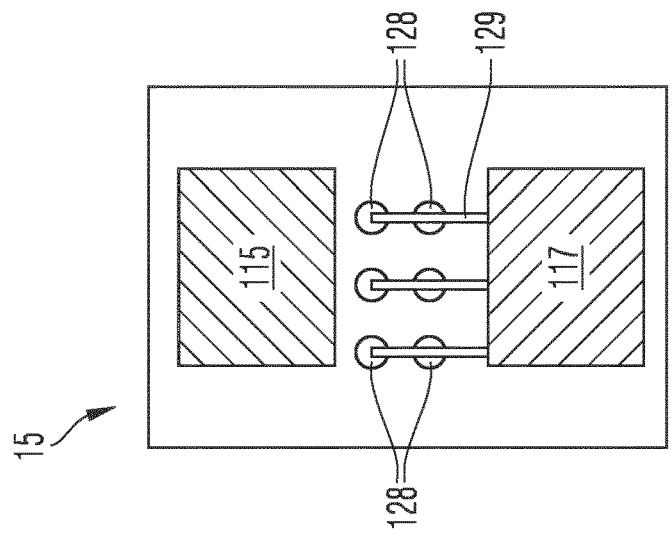

According to further embodiments, which are illustrated in FIG. 9, the second contact element 117 may be connected to the second semiconductor layer 110 via patterned parts of the conductive layer 129 and contact openings 128. The contact openings 128 may be formed in the first semiconductor layer 100. For example, a second passivation layer 122 may, in this case, be additionally formed over the conductive layer 129.

Figure 10:
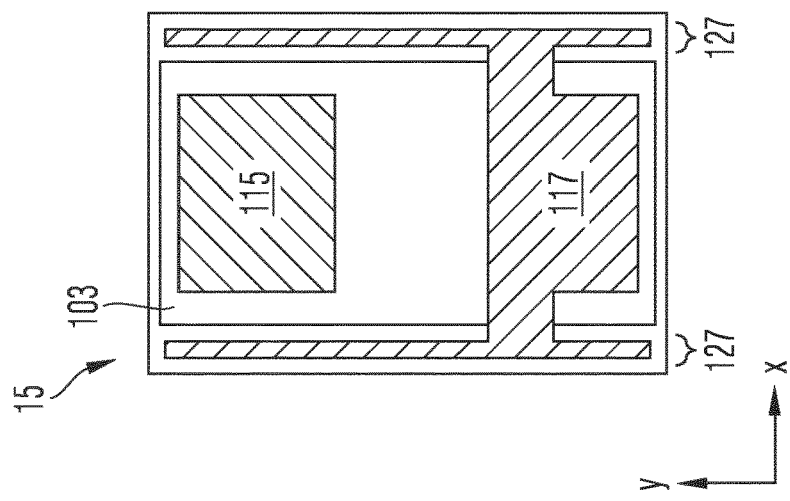

According to further embodiments, as illustrated in FIG. 10, the first semiconductor layer 100 may be patterned in such a manner that it is circularly enclosed by exposed parts 125 of the second semiconductor layer 110. In this case, the mesa 103 is formed along both the x-direction and along the y-direction. Furthermore, the first and second contact elements 115, 117 and the contact portion 127 may be formed similarly as described above.

Figure 11:
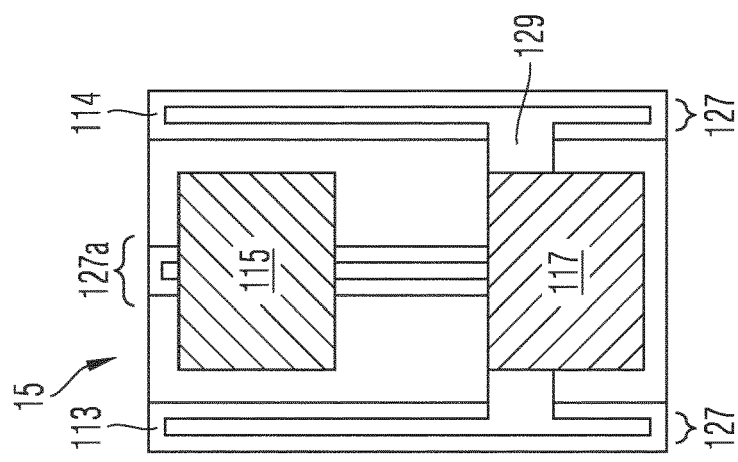

According to further embodiments, as illustrated in FIG. 11, a conductive layer 129 may be provided, which connects the second contact element 117 to the second semiconductor layer 110. Parts of the conductive layer 129 are arranged both on a first exposed part 113 of the second semiconductor layer 110 and on a second exposed part 114 of the second semiconductor layer 110. Furthermore, the first semiconductor layer 100 may be patterned in such a manner that an opening is also formed in the first semiconductor layer 100 in a central part, whereby an additional contact portion 127a is formed. The conductive layer 129 is arranged in this opening and isolated from the first contact element 115 located above it by a second passivation layer 122. Furthermore, the second passivation layer 122 is also arranged over further parts of the conductive layer 129.

Figure 12:
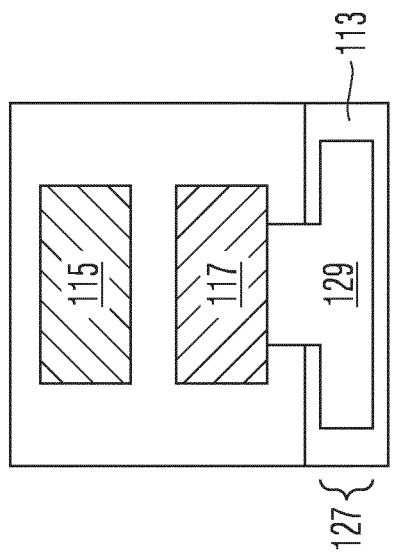

According to embodiments that are illustrated in FIG. 12, the contact portion 127 from the second contact element 117 to the second semiconductor layer 110 may be arranged on only one side of the optoelectronic semiconductor chip 15. For example, the first semiconductor layer 100 is, in this case, patterned in such a manner that only an exposed area 113 of the second semiconductor layer 110 is formed.

Figure 13:
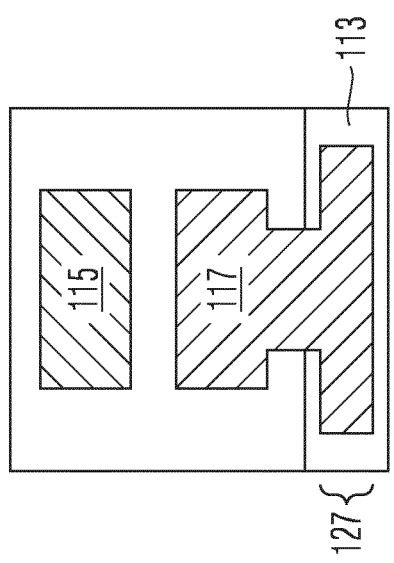

As illustrated in FIG. 13, the first semiconductor layer 100 may be patterned in such a manner that the exposed area 113 of the second semiconductor layer is arranged on the side of the second contact element 117 facing away from the first contact element 115. As a result, the contact portion 127 does, for example, not extend along the first and second contact elements 115, 117, but it is only arranged on one side of the second contact element 117.

Figure 14:
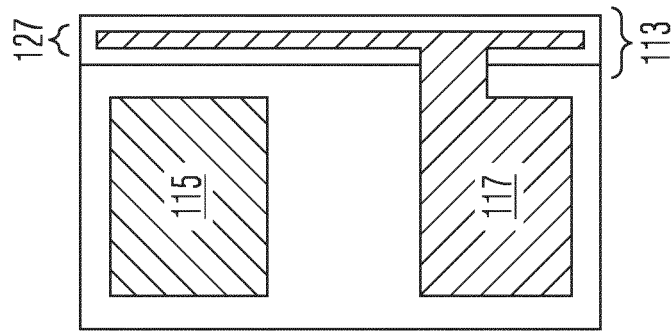

As illustrated in FIG. 14, the second contact element may, in this case, be connected to the second semiconductor layer 110 via the conductive layer 129.

Figure 15A:
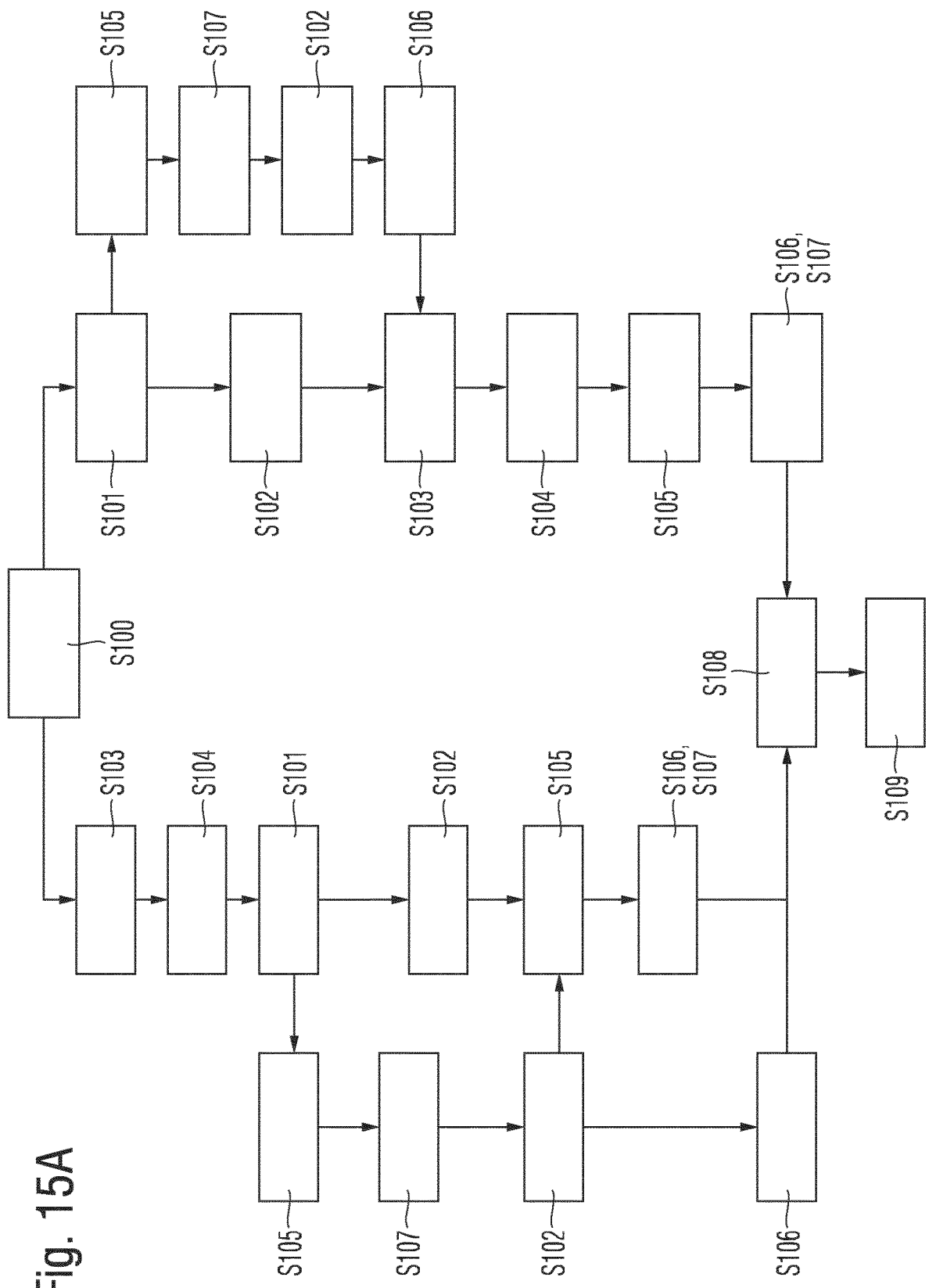

Various method steps may be combined with one another to produce the semiconductor element described. FIG. 15A shows a schematic arrangement of method steps for producing the semiconductor element described. Following epitaxial growing (S100) of the semiconductor layers to form a semiconductor layer stack that includes the first and the second semiconductor layers, a mesa 103 may be initially defined (S101), as illustrated in the right-hand part of FIG. 15A. Subsequently, a (first) passivation layer may be applied (S105), optionally followed by the production of second openings 124 (S107), the production of a connecting element 126 (S102) and the production of first openings 121 (S106), for example, in the first passivation layer.

Alternatively, after having defined the mesa (S101), the method may include forming a connecting element 126 (S102) and forming a conductive intermediate layer (S103). Then, according to both method variants, a first current spreading layer is formed (S104), followed by the formation of a (first) passivation layer (S105). Subsequently, first and second openings 121, 124 are formed in the passivation layer (S106, S107).

In accordance with the method sequence illustrated on the left-hand side, the contact to the first semiconductor layer may also be established initially. For example, a conductive intermediate layer is initially formed (S103), followed by the formation of a first current spreading layer (S104). The mesa is then defined (S101). Thereafter, a (first) passivation layer may, for example, be formed (S105), followed by the production of second openings (S107) and the formation of a connecting element 126 (S102). Furthermore, first openings 121 may, for example, be formed in the first passivation layer 120 (S106).

Alternatively, a (second) passivation layer may be formed (S105) before the first openings are formed (S106).

According to a variant of the method, connecting elements 126 may be formed (S102) after the mesa has been defined (S101), followed by the formation of a passivation layer (S105). First and second openings are then formed (S106, S107).

Subsequently, according to all method variants, a conductive layer is formed which forms the first and the second contact elements (S108). The conductive layer mentioned here may have several sub-layers. The individual chips are then singulated (S109). According to the method sequence on the right-hand side, the contact portions 127, which are connected to the second semiconductor layer 110, are isolated from the outside. According to the process variant which, after the formation of the connecting element 126 (S102), provides for the formation of the first openings (S106) followed by the formation of the conductive layer (S108), the contact portions are not isolated. The method sequences, which include the formation of a passivation layer (S105), result in the contact portion being isolated from the outside.

FIG. 15B illustrates method variants according to further embodiments. The method variants illustrated are executed similarly as in FIG. 11A. Deviating from the variants illustrated in FIG. 11A, the method here initially includes, according to all method variants, the formation of a conductive layer 129 (S111), followed by the formation of a (second) passivation layer (S110). Subsequently, a conductive layer for producing the first and second contact elements is formed (S108), followed by a process for singulating the semiconductor chips (S109). Here, too, the formation of the conductive layer for producing the first and second contact elements may comprise the formation of several sub-layers.

Similarly to FIG. 15A, here, too, those method variants which include the formation of a passivation layer (S105) lead to the corresponding parts of the conductive layer 129 being isolated from the outside. In the case of the method variant on the left-hand side, which does not include the formation of a passivation layer (S105), the conductive layer 129 is not covered by an insulating material.

As has been described, the method comprises the formation of a conductive layer in each case, whereby the first and the second contact elements are formed. The first and the second contact elements are thus formed at the same time, so that process fluctuations may not cause different layer thicknesses. Furthermore, also intermediate layers between the first contact element and the first semiconductor layer and between the second contact element and the first semiconductor layer may each be identical and formed by common methods. This ensures that the first main surface of the first contact element lies at the same vertical height as the first main surface of the second contact element. According to further embodiments, the respectively identical intermediate layers may also be formed by different methods.

Figure 16:
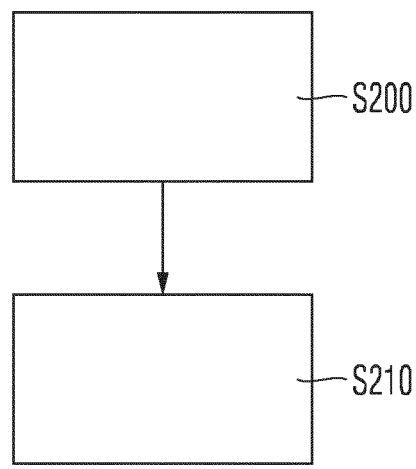
FIG. 16 summarizes a method according to embodiments.

FIG. 16 summarizes a method according to embodiments.

A method for producing an optoelectronic semiconductor element comprising an optoelectronic semiconductor chip includes forming (S200) a layer stack that includes a first semiconductor layer of a first conductivity type and a second semiconductor layer of a second conductivity type, and forming (S210) an electrically conductive layer, whereby a first contact element, which is connected to the first semiconductor layer in an electrically conductive manner, and a second contact element, which is connected to the second semiconductor layer in an electrically conductive manner, are formed over the first semiconductor layer.

Figure 17:
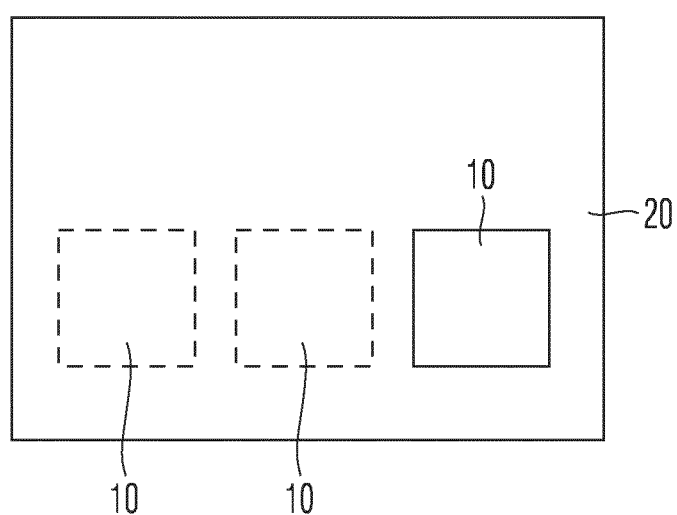
FIG. 17 shows a schematic view of an optoelectronic device.

FIG. 17 shows an optoelectronic device according to embodiments. The optoelectronic device 20 includes the optoelectronic semiconductor element 10 described. For example, the optoelectronic device 20 may include a multitude of optoelectronic semiconductor elements 10. The optoelectronic semiconductor elements 10 may each emit electromagnetic radiation of different wavelengths, for example, in the colors red, green and blue. The optoelectronic semiconductor elements 10 may be arranged in different patterns, for example, in rows and columns, as a checkerboard pattern or in any other pattern. For example, the optoelectronic device 20 may be a display device or a video wall. According to further embodiments, the optoelectronic device may be part of a motor vehicle lighting device, for example, a headlight, a tail light, a brake light or a direction indicator.

Although specific embodiments have been illustrated and described herein, persons skilled in the art will recognize that the specific embodiments shown and described may be replaced by a multitude of alternative and/or equivalent embodiments without departing from the scope of the claims. The application is intended to cover any adaptations or variations of the specific embodiments discussed herein. Therefore, the invention is to be limited only by the claims and their equivalents.

LIST OF REFERENCES

10 optoelectronic semiconductor element
15 optoelectronic semiconductor chip
16 emitted electromagnetic radiation
20 optoelectronic device
30 carrier
31 first main surface of the carrier
100 first semiconductor layer
101 first main surface of the first semiconductor layer
103 mesa
105 active zone
110 second semiconductor layer
111 second main surface of the second semiconductor layer
113 first exposed part of the second semiconductor layer
114 second exposed part of the second semiconductor layer
115 first contact element
116 first main surface of the first contact element
116a surface portion at the same height
117 second contact element
118 first main surface of the second contact element
119 approximated second main surface of the second semiconductor layer
120 first passivation layer
121 first opening
122 second passivation layer
123 first current spreading layer
124 second opening
125 exposed part of the second semiconductor layer
126 connecting element
127 contact portion
127a additional contact portion
128 contact opening
129 conductive layer
131 first landing area
132 second landing area
S100 epitaxially growing
S101 defining the mesa
S102 forming a connecting element
S103 forming a conductive intermediate layer
S104 forming a first current spreading layer
S105 forming a passivation layer
S106 forming the first openings
S107 forming the second openings
S108 forming a conductive layer for producing the first and second contact element
S109 singulating the semiconductor chips
S111 forming a conductive layer

The invention claimed is:

1. An optoelectronic semiconductor element comprising an optoelectronic semiconductor chip, the optoelectronic semiconductor chip comprising:

a first semiconductor layer of a first conductivity type;
a second semiconductor layer of a second conductivity type;
a first contact element electrically connected to the first semiconductor layer;
a second contact element electrically connected to the second semiconductor layer, wherein the first semiconductor layer and the second semiconductor layer are arranged one above the other to form a layer stack, wherein the first semiconductor layer is patterned so that part of the second semiconductor layer is exposed, wherein the first contact element is arranged over the first semiconductor layer, wherein the second contact element is arranged over the first semiconductor layer, and wherein parts of the first contact element are arranged at the same vertical height as parts of the second contact element within an area in which the second contact element overlaps with the first semiconductor layer; and
a conductive layer connected to the second semiconductor layer and to the second contact element with parts of the conductive layer being arranged between the first contact element and the first semiconductor layer.

2. The optoelectronic semiconductor element according to claim 1, wherein a distance between a first main surface of the first contact element and a first main surface of the first semiconductor layer is identical to the distance between a first main surface of the second contact element and the first main surface of the first semiconductor layer.

3. The optoelectronic semiconductor element according to claim 1, wherein the first and the second contact elements each have an identical composition.

4. The optoelectronic semiconductor element according to claim 1, wherein the first and the second contact elements each form a topmost metalization level of the semiconductor chip.

5. The optoelectronic semiconductor element according to claim 1, wherein intermediate layers arranged between the first contact element and the first semiconductor layer and arranged between the second contact element and the first semiconductor layer are identical.

6. The optoelectronic semiconductor element according to claim 1, further comprising a first passivation layer arranged between the first semiconductor layer and, in each case, the first and second contact elements.

7. The optoelectronic semiconductor element according to claim 1, wherein at least 10% of a first main surface of the first contact element is arranged at the same vertical height as a first main surface of the second contact element.

8. The optoelectronic semiconductor element according to claim 1, further comprising a connecting element arranged between the second contact element and the second semiconductor layer.

9. An optoelectronic device comprising the optoelectronic semiconductor element according to claim 1.

10. The optoelectronic device according to claim 9, selected from a display device, a video wall, a motor vehicle headlight, a motor vehicle rear light, a motor vehicle brake light, a motor vehicle direction indicator, or combinations thereof.

11. An optoelectronic semiconductor element comprising an optoelectronic semiconductor chip, the optoelectronic semiconductor chip comprising:
a first semiconductor layer of a first conductivity type,
a second semiconductor layer of a second conductivity type,
a first contact element electrically connected to the first semiconductor layer, and
a second contact element electrically connected to the second semiconductor layer, wherein the first semiconductor layer and the second semiconductor layer are arranged one above the other to form a layer stack, wherein the first contact element is arranged over the first semiconductor layer, wherein the second contact element is arranged over the first semiconductor layer, and wherein intermediate layers arranged between the first contact element and the first semiconductor layer being identical to intermediate layers arranged between the second contact element and the first semiconductor layer; and
a conductive layer connected to the second semiconductor layer and to the second contact element with parts of the conductive layer being arranged between the first contact element and the first semiconductor layer.

12. The optoelectronic semiconductor element according to claim 11, wherein a distance between a first main surface of the first contact element and the first main surface of the first semiconductor layer is identical to a distance between a first main surface of the second contact element and the first main surface of the first semiconductor layer.

13. The optoelectronic semiconductor element according to claim 10, wherein the first and the second contact elements each have an identical composition.

14. The optoelectronic semiconductor element according to claim 11, wherein the second contact element is electrically connected to the second semiconductor layer via contact openings in the first semiconductor layer.

15. The optoelectronic semiconductor element according to claim 11, further comprising a carrier on which the optoelectronic semiconductor chip is applied.

16. The optoelectronic semiconductor element according to claim 15, wherein a second main surface or an approximated second main surface of the second semiconductor layer is parallel to a first main surface of the carrier.

* * * * *